US 11,776,951 B2

(12) United States Patent
Ren et al.

(10) Patent No.: US 11,776,951 B2
(45) Date of Patent: *Oct. 3, 2023

(54) TVS DIODE CIRCUIT WITH HIGH ENERGY DISSIPATION AND LINEAR CAPACITANCE

(71) Applicant: Semtech Corporation, Camarillo, CA (US)

(72) Inventors: Liping Ren, Los Angeles, CA (US); William Allen Russell, Thousand Oaks, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/662,890

(22) Filed: May 11, 2022

(65) Prior Publication Data

US 2022/0271027 A1    Aug. 25, 2022

Related U.S. Application Data

(63) Continuation of application No. 16/788,034, filed on Feb. 11, 2020, now Pat. No. 11,362,083.

(51) Int. Cl.
*H01L 27/02* (2006.01)
*G05F 3/18* (2006.01)
(Continued)

(52) U.S. Cl.
CPC ............ *H01L 27/0255* (2013.01); *G05F 3/18* (2013.01); *H01L 23/62* (2013.01); *H01L 27/02* (2013.01);
(Continued)

(58) Field of Classification Search
CPC ... H01L 23/62; H01L 27/0262; H01L 23/535; H01L 27/0255; H01L 29/0649;
(Continued)

(56) References Cited

U.S. PATENT DOCUMENTS 4,941,063 A    7/1990  McCartney et al.
5,440,441 A    8/1995  Ahuja
(Continued)

FOREIGN PATENT DOCUMENTS

CN    110323189 A     10/2019
EP    0393333 A2     10/1990
KR    20150096914 A   8/2015

*Primary Examiner* — Danny Nguyen
(74) *Attorney, Agent, or Firm* — Robert D. Atkins; PATENT LAW GROUP: Atkins and Associates, P.C.

(57) ABSTRACT

A TVS circuit having a first diode with a cathode coupled to a first terminal and an anode coupled to a first node. A second diode has an anode coupled to a second node and a cathode coupled to a third node. A third diode is coupled between the first node and second node. A fourth diode is coupled between the first node and third node. A fifth diode is coupled between the second node and a second terminal. A sixth diode is coupled between the second terminal and the third node. A seventh diode can be coupled between the second terminal and an intermediate node between the fifth diode and sixth diode. The first diode is disposed on a first semiconductor die, while the second diode is disposed on a second semiconductor die. Alternatively, the first diode and second diode are disposed on a single semiconductor die.

18 Claims, 5 Drawing Sheets

(51) Int. Cl.
    *H01L 27/08*     (2006.01)
    *H02H 3/20*     (2006.01)
    *H02H 9/04*     (2006.01)
    *H01L 23/62*     (2006.01)

(52) U.S. Cl.
    CPC .......... *H01L 27/0814* (2013.01); *H02H 3/202* (2013.01); *H02H 9/042* (2013.01); *H02H 9/046* (2013.01); *H02H 9/04* (2013.01)

(58) Field of Classification Search
    CPC ..... H01L 29/866; H01L 21/265; H01L 27/02; H01L 27/08; H01L 27/0814; H01L 2/0248; H02H 9/04; H02H 9/06; H02H 9/00; H02H 7/12; H02H 1/04; H02H 3/22; H02H 9/046; H02H 9/02; H02H 3/202; G05F 3/18
    USPC .................................................. 361/117–119
    See application file for complete search history.

(56) References Cited

U.S. PATENT DOCUMENTS

| | | | |
|---|---|---|---|
| 8,254,071 | B2 | 8/2012 | Dunnihoo et al. |
| 10,062,682 | B1 | 8/2018 | Mallikarjunaswamy et al. |
| 10,373,947 | B2 | 8/2019 | Mallikarjunaswamy et al. |
| 11,362,083 | B2 * | 6/2022 | Ren ................ H01L 27/0814 |
| 2003/0123208 | A1 | 7/2003 | Napiorkowski |
| 2004/0021178 | A1 | 2/2004 | Larson |
| 2004/0201035 | A1 * | 10/2004 | Oka ..................... H01L 29/74 |
| | | | 257/107 |
| 2008/0218922 | A1 | 9/2008 | Mallikararjunaswamy et al. |
| 2009/0268361 | A1 | 10/2009 | Mallikarjunaswamy |
| 2011/0092246 | A1 | 4/2011 | Ginsburg et al. |
| 2012/0091504 | A1 | 4/2012 | Davis et al. |
| 2022/0123549 | A1 * | 4/2022 | Dong ..................... H04B 3/548 |

\* cited by examiner

TVS DIODE CIRCUIT WITH HIGH ENERGY DISSIPATION AND LINEAR CAPACITANCE

CLAIM TO DOMESTIC PRIORITY

The present application is a continuation of U.S. patent application Ser. No. 16/788,034, now U.S. Pat. No. 11,362,083, filed Feb. 11, 2020, which application is incorporated herein by reference.

FIELD OF THE INVENTION

The present invention relates in general to semiconductor devices and, more particularly, to an integrated transient voltage suppression (TVS) circuit with high energy dissipation and linear capacitance for protection of an RF antenna in an automotive system.

BACKGROUND

Semiconductor devices are commonly found in modern electronic products. Semiconductor devices perform a wide range of functions such as signal processing, high-speed calculations, transmitting and receiving electromagnetic signals, controlling electronic devices, photo-electric, and creating visual images for television displays. Semiconductor devices are found in the fields of automotive, communications, power conversion, networks, computers, entertainment, and consumer products. Semiconductor devices are also found in military applications, aviation, industrial controllers, and office equipment.

In a typical automotive system, an antenna receives an radio frequency (RF) signal containing audio, video, navigation, communication, or other data or information. The antenna is coupled to a receiver to filter and down-convert the RF signal, and signal processing system to handle the baseband data. For example, GPS navigation coordinates received via the RF antenna are processed through the receiver and signal processing system to present navigation information on the automotive display for use by the occupants. Alternatively, an RF signal from a music station is received at the RF antenna and processed through the receiver and signal processing system to play music for the occupants of the automobile.

The RF antenna and associated circuitry in an automotive application, such as digital audio broadcast (DAB), satellite radio (XM), television (TV), and global positioning system (GPS), are susceptible to damage from electrostatic overstress (EOS) and electrostatic discharge (ESD) events. Protecting the semiconductor devices in the receiver and signal processing system is challenging due to the high frequency nature and high power of the RF signal at the RF input pins. The RF signal contains a DC voltage of 5-12 VDC and an AC voltage of 3-5 volts.

One known EOS and ESD protection scheme uses a high-voltage TVS diode at the RF input pins to dissipate transient conditions. However, the non-linearity of the capacitance in the TVS diode can cause undesirable harmonics in the RF signal. Alternatively, a low capacitance TVS diode can be used but typically lacks the requisite clamping voltage and energy dissipation capabilities. Thus, high energy dissipation, low capacitance TVS protection is difficult to implement.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1:
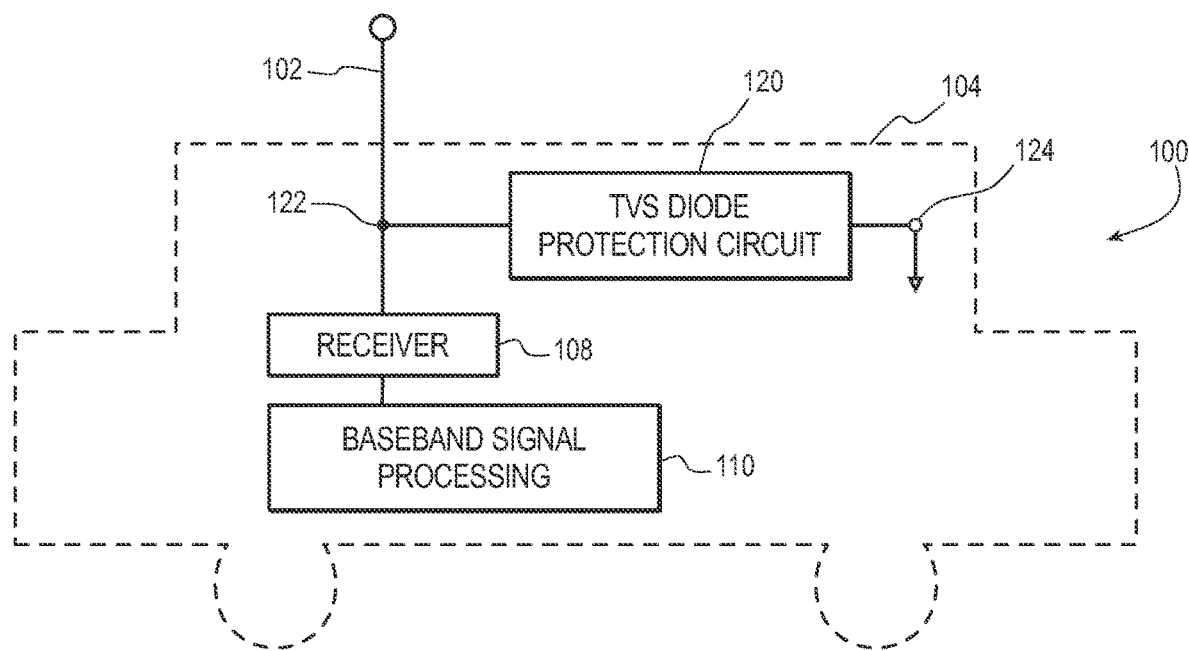
FIG. 1 illustrates an RF antenna in an automotive application.

FIG. 1 illustrates an automotive system 100 with RF antenna 102 mounted to automobile 104. RF antenna 102 can be directed to DAB, XM, TV, and GPS applications. Receiver 108, disposed within automobile 104, receives the RF signal from antenna 102. Receiver 108 filters and demodulates the RF signal to baseband data or information. Baseband signal processing circuit 110 processes the baseband data according to the application. For example, GPS navigation coordinates received via the RF antenna are processed through receiver 108 and signal processing circuit 110 to present navigation information on the automotive display for use by the occupants of automobile 104. Alternatively, an RF signal from a music station is received at RF antenna 102 and processed through receiver 108 and signal processing circuit 110 to play music for the occupants over the audio system of automobile 104.

Automotive system 100 is susceptible to damage from EOS and ESD events. The EOS or ESD event may be a lightning strike to RF antenna 102, or passing in close proximity to high voltage power lines with the incident electromagnetic field. An integrated TVS diode circuit 120 provides protection for the semiconductor devices in receiver 108 and signal processing circuit 110. TVS diode circuit 120 includes terminal 122 coupled to the RF signal path or pin of antenna 102 and terminal or pin 124 coupled to ground potential.

Figure 2:
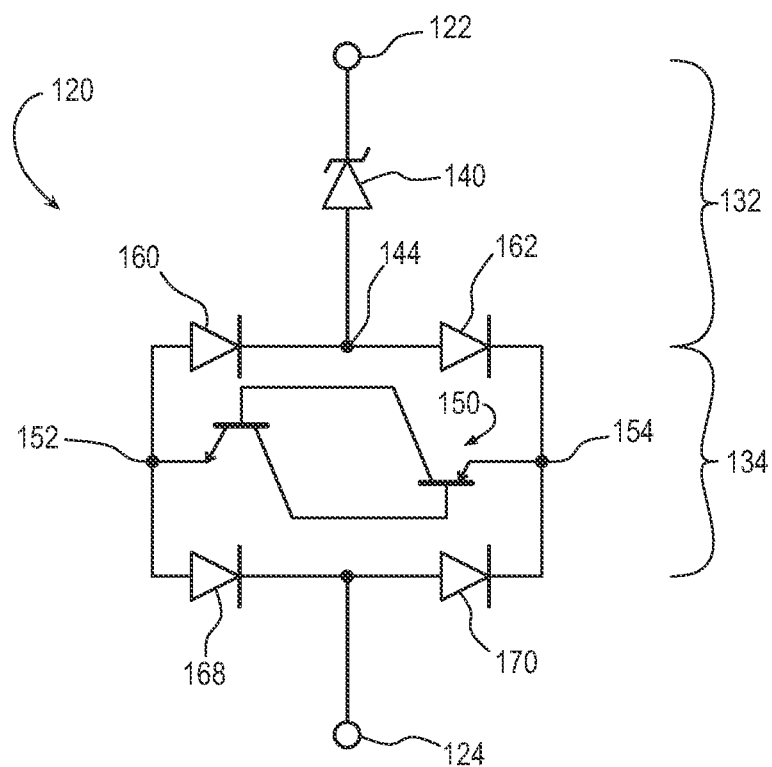
FIG. 2 illustrates an asymmetric TVS diode circuit for protecting the RF antenna and associated systems.

FIG. 2 illustrates further detail of TVS diode circuit 120 in an asymmetrical common mode application including high voltage portion 132 and low voltage portion 134. High voltage portion 132 of TVS diode circuit 120 includes high-voltage TVS diode 140 coupled between terminal or pin 122 and node 144. TVS diode 140 is particularly well-suited for high voltage transient conditions in an EOS or ESD event. In the automotive application, high voltage is greater than or equal to 16V in the positive polarity for a 12V vehicle, and greater than or equal to 28V for a 24V vehicle.

Under normal operating conditions, TVS diode 140 is a high impedance to the DC input voltage from antenna 102 in one polarity, and a high impedance to the AC input voltage in the opposite polarity. The asymmetrical construction of TVS diode 140 allows a low clamping voltage in each polarity, while presenting a high impedance at the desired operating voltages under normal operating conditions.

Low voltage portion 134 of TVS diode circuit 120 includes low-voltage TVS diode 150 with snap-back characteristics coupled between node 152 and node 154. In one embodiment TVS diode 150 is implemented as a silicon controlled rectifier (SCR). Low voltage portion 134 of TVS diode circuit 120 further includes a low-capacitance diode bridge with diode 160 and diode 162 coupled between node 152 and 154 with node 144 at the intermediate point between diodes 160-162, and diode 168 and diode 170 coupled between node 152 and node 154 with terminal or pin 124 at the intermediate point between diodes 168-170. The diode bridge 160-162, 168-170 lowers the overall loading capacitance of the device between terminal 122 and terminal 124. Under transient conditions, the snap-back characteristic of TVS diode 150 with diode bridge 160-162, 168-170 reduces the protection or clamping voltage between terminals 122 and 124, as compared to using only a high-voltage TVS element. In addition, TVS diode 150 with diode bridge 160-162, 168-170 reduces and linearizes the capacitance of TVS diode circuit 120 to reduce harmonics in the RF signal. Accordingly, TVS diode circuit 120 provides protection for the RF signal, i.e., provides a signal path to dissipate energy and heat, without introducing harmonics that would distort the RF signal. TVS diode circuit 120 provides high energy dissipation via TVS diode 140 and low capacitance with diode bridge 160-162, 168-170.

During an EOS or ESD event of a positive polarity at terminal 122 with respect to terminal 124, i.e., the voltage between terminal 122 and 124 exceeds the breakdown voltage of TVS diode circuit 120, TVS diode 140 will be reversed biased and current will flow from cathode to anode of the diode. The breakdown voltage of TVS diode circuit 120 is the sum of the breakdown voltage of TVS diode 140 plus the breakdown voltage of TVS diode 150 plus the forward bias voltages of the conducting portion of diode bridge 160-162, 168-170. Diode 162 will be forward biased with current flowing from anode to cathode, TVS diode 150 will be reverse biased with current flowing from cathode to anode, and diode 168 will be forward biased with current flowing from anode to cathode to terminal 124. In the positive polarity EOS or ESD event, the current discharge path is from terminal 122 through TSV diode 140, diode 162, TVS diode 150, and diode 168 to terminal 124.

For an EOS or ESD event a negative polarity at terminal 122 with respect to terminal 124, diode 170 will be forward biased with current flowing from anode to cathode, TVS diode 150 will be reverse biased with current flowing from cathode to anode, and diode 160 will be forward biased with current flowing from anode to cathode to terminal 122. TVS diode 140 will be forward biased and current will flow from anode to cathode of the diode to terminal 122. In the negative polarity EOS or ESD event, the current discharge path is from terminal 124 through diode 170, TSV diode circuit 150, diode 160, and TVS diode 140 to terminal 122.

Figure 3:
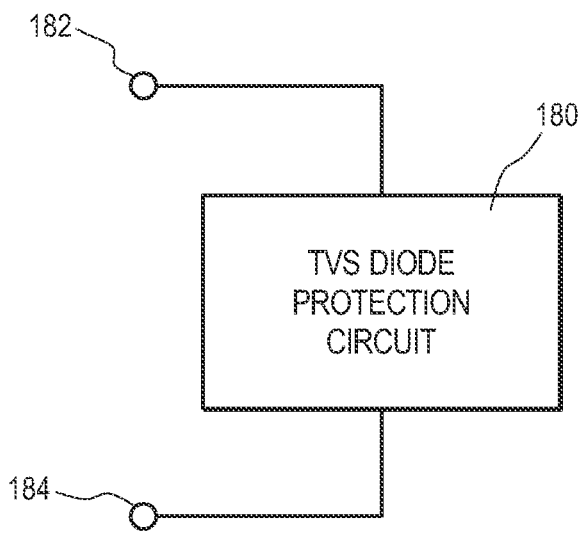
FIG. 3 illustrates a symmetric TVS diode circuit for protecting the RF antenna and associated systems.
Figure 4:
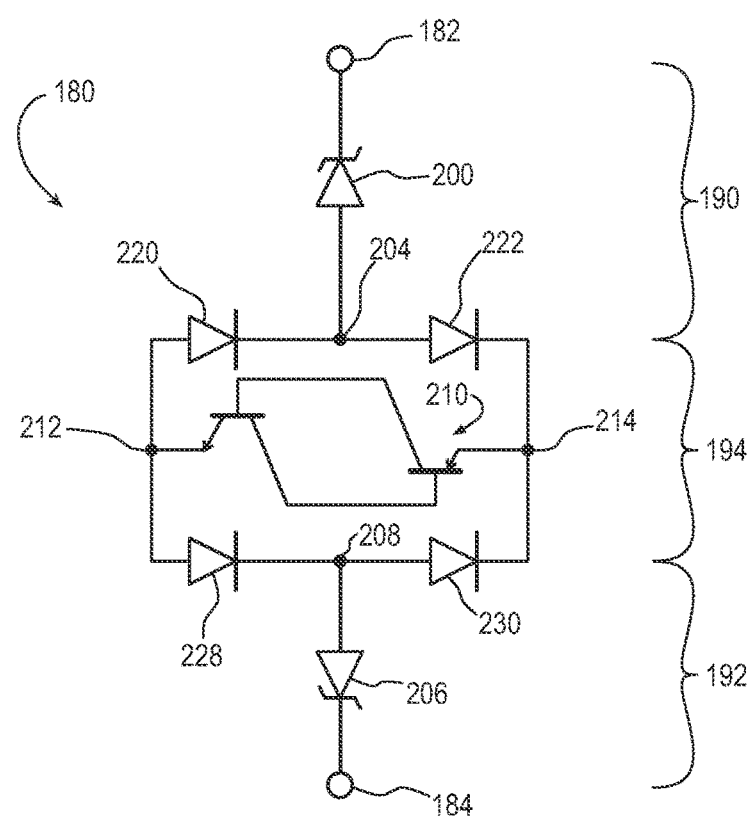
FIG. 4 illustrates further detail of the TVS diode circuit of FIG. 3.

FIG. 3 illustrates another embodiment for a symmetrical differential application. TVS diode circuit 180 is coupled between terminals or pins 182 and 184 for a differential RF signal from the RF antenna. FIG. 4 provides further detail of TVS diode circuit 180 including high voltage portions 190 and 192 and low voltage portion 194. High voltage portion 190 of TVS diode circuit 180 includes high-voltage TVS diode 200 coupled between terminal or pin 182 and node 204. High voltage portion 192 of TVS diode circuit 180 includes high-voltage TVS diode 206 coupled between terminal or pin 184 and node 208. TVS diodes 200 and 206 are particularly well-suited for high voltage transient conditions in an EOS or ESD event. In the automotive application, high voltage is greater than or equal to 16V in the positive polarity for a 12V vehicle, and greater than or equal to 28V for a 24V vehicle. Under normal operating conditions, TVS diodes 200 and 206 are a high impedance to the DC input voltage from the RF antenna in one polarity, and a high impedance to the AC input voltage in the opposite polarity. The symmetrical construction of TVS diode 180 allows a low clamping voltage in each polarity while presenting a high impedance at the desired operating voltages under normal operating conditions.

Low voltage portion 194 of TVS diode circuit 180 includes low-voltage TVS diode 210 with snap-back characteristics coupled between node 212 and node 214. In one embodiment TVS diode 210 is implemented as an SCR. Low voltage portion 194 of TVS diode circuit 180 further includes a low-capacitance diode bridge with diode 220 and diode 222 coupled between node 212 and 214 with node 204 at the intermediate point between diodes 220-222, and diode 228 and diode 230 coupled between node 212 and node 214 with node 208 at the intermediate point between diodes 228-230. The diode bridge 220-222, 228-230 lowers the overall loading capacitance of the device between terminal 182 and terminal 184. Under transient conditions, the snap-back characteristic of TVS diode 210 with diode bridge 220-222, 228-230 reduces the protection or clamping voltage between terminals 182 and 184, as compared to using only a high-voltage TVS element. In addition, TVS diode 210 with diode bridge 220-222, 228-230 reduces and linearizes the capacitance of TVS diode circuit 180 to reduce harmonics in the RF signal. Accordingly, TVS diode circuit 180 provides protection for the RF signal without introducing harmonics that would distort the RF signal. TVS diode circuit 180 provides high energy dissipation via TVS diode 200 and low capacitance with diode bridge 220-222, 228-230.

During an EOS or ESD event of a positive polarity at terminal 182 with respect to terminal 184, i.e., the voltage between terminal 182 and 184 exceeds the breakdown voltage of TVS diode circuit 180, TVS diode 200 will be reversed biased and current will flow from cathode to anode of the diode. The breakdown voltage of TVS diode circuit 180 is the sum of the breakdown voltage of TVS diode 200 plus the breakdown voltage of TVS diode 210 plus the forward bias voltages of the conducting portion of diode bridge 220-222, 228-230 plus the forward bias voltage of TVS diode 206. Diode 222 will be forward biased with current flowing from anode to cathode, TVS diode 210 will be reverse biased with current flowing from cathode to anode, and diode 228 will be forward biased with current flowing from anode to cathode, and TVS diode 206 will be forward biased with current flowing from anode to cathode to terminal 184. In the positive polarity EOS or ESD event, the current discharge path is from terminal 182 through TSV diode 200, diode 222, TVS diode 210, diode 228, and TVS diode 206 to terminal 184.

For an EOS or ESD event a negative polarity at terminal 182 with respect to terminal 184, TVS diode 206 will be reversed biased and current will flow from cathode to anode of the diode. Diode 230 will be forward biased with current flowing from anode to cathode, TVS diode 210 will be reverse biased with current flowing from cathode to anode, and diode 220 will be forward biased with current flowing from anode to cathode. TVS diode 200 will be forward biased and current will flow from anode to cathode of the diode to terminal 182. In the negative polarity EOS or ESD event, the current discharge path is from terminal 184 through TSV diode 206, diode 230, TVS diode 210, diode 220, and TVS diode 200 to terminal 182.

Figure 5A:
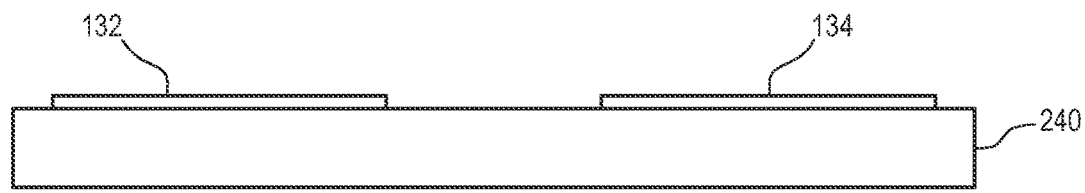
FIGS. 5a-5b illustrate the TVS diode circuit formed on one or more semiconductor die.
Figure 5B:
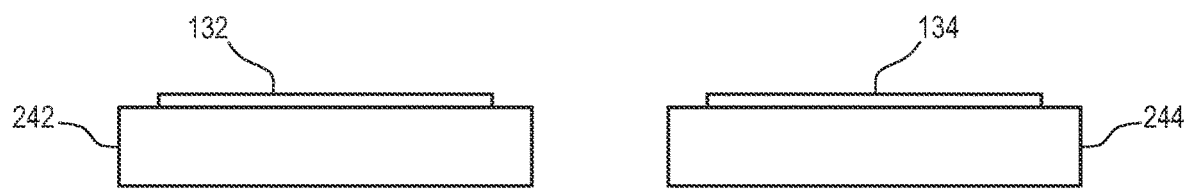

TVS diode circuit 120 or 180 can be implemented on one monolithic semiconductor die or multiple semiconductor die. FIG. 5a shows high voltage portion 132, as well as low voltage portion 134, of TVS diode circuit 120 formed on one monolithic semiconductor die 240. FIG. 5b shows high voltage portion 132 of TVS diode circuit 120 formed on semiconductor die 242, and low voltage portion 134 formed on semiconductor die 244. In a similar manner, high voltage portions 190 and 192 of TVS diode circuit 180 can be formed on semiconductor die 242, and low voltage portion 194 can be formed on semiconductor die 244. Alternatively, high voltage portions 190 and 192 and low voltage portion 194 can be formed on a single monolithic semiconductor die 240.

TVS diode circuit 120 is applicable to automotive systems within automobile 104 and must be able to withstand 12V and 24V short-to-battery conditions. The working voltage $V_{RWM}$, i.e., the voltage where TVS diode circuit 120 is in a high impedance state, between terminals 122 and 124 is greater than or equal to 16V in the positive polarity for a 12V vehicle, and greater than or equal to 28V for a 24V vehicle. The trigger voltage, i.e., the voltage at which TVS diode circuit 120 transitions to a low impedance or conducting state, is the sum of the breakdown voltage VBR of high-voltage TVS diode 140 and the turn-on voltage of the low voltage snap-back TVS diode 150.

Once TVS diode circuit 120 is in a conducting mode, the minimum holding voltage $V_{HOLDING}$ for TVS diode circuit 120 to transition from conducting back to non-conducting state must be above the battery DC voltage levels in order to avoid device latch-up. The holding voltage is the voltage that the device holds at before turning off. The holding voltage is controlled by adjusting, the sum of the breakdown voltage of the high-voltage TVS diode 140 and the holding voltage of the snap-back TVS between terminals 122 and 124, to be greater than the maximum DC voltage of the circuit.

Figure 6:
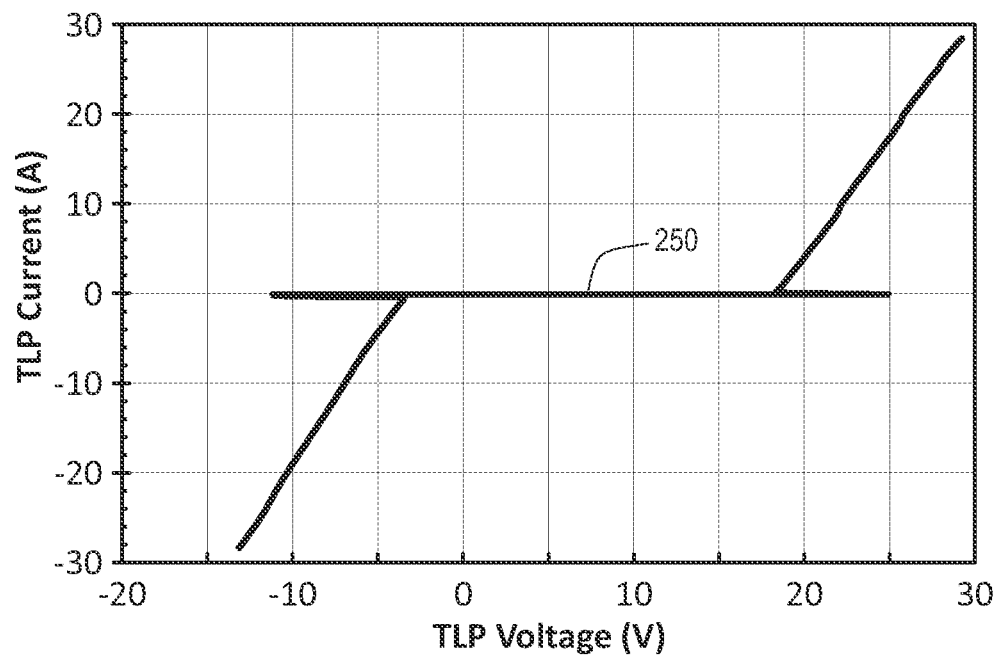
FIG. 6 illustrates a waveform plot of TVS response in a 12V application.
Figure 7:
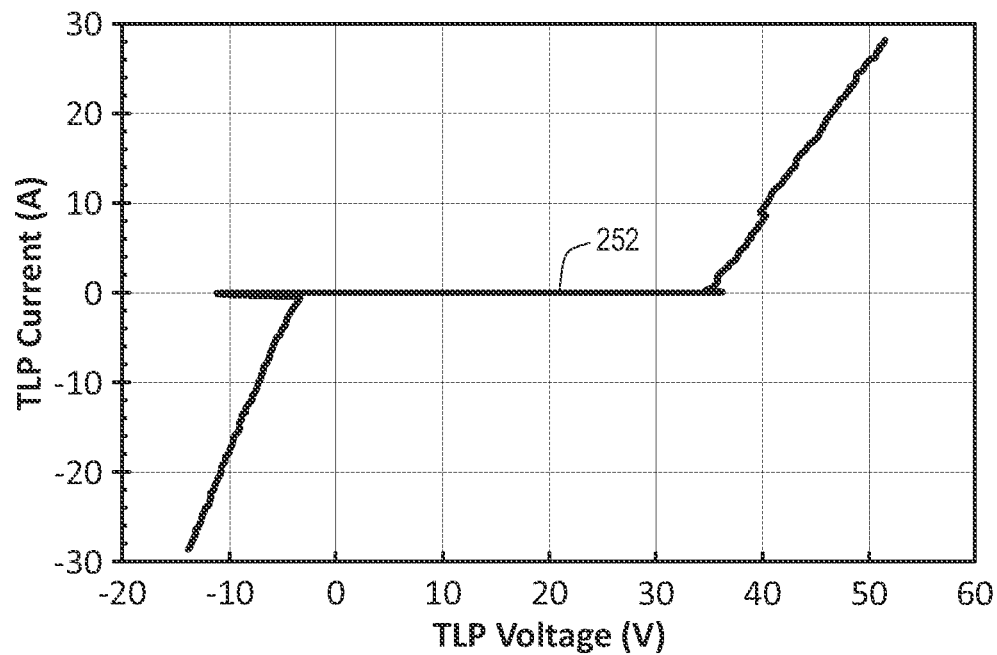
FIG. 7 illustrates a waveform plot of TVS response in a 24V application.
Figure 8:
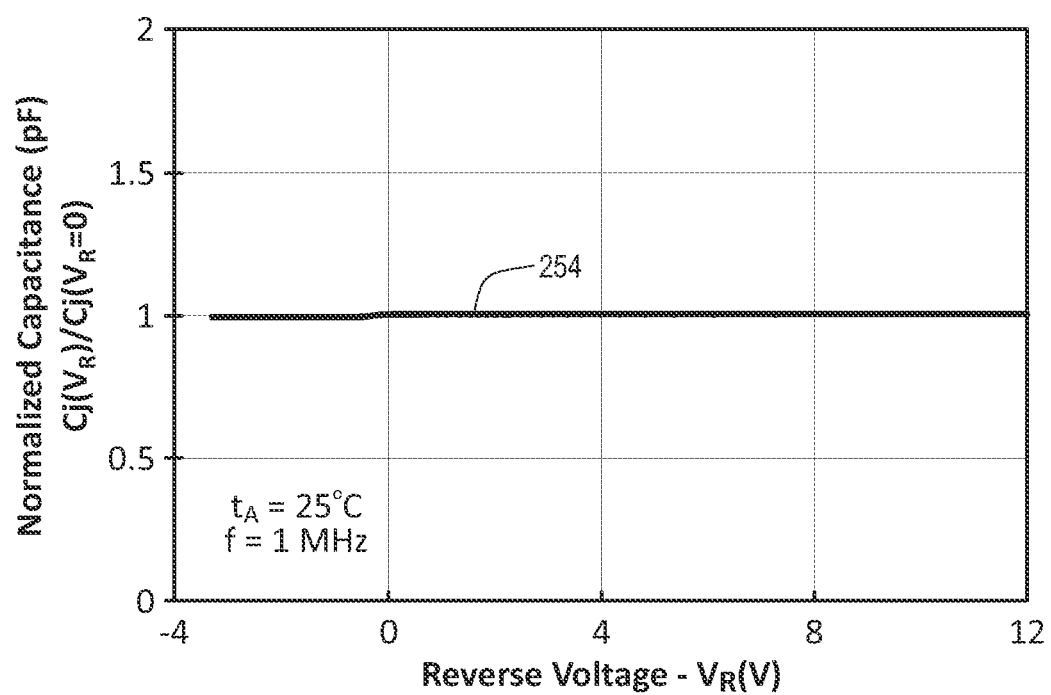
FIG. 8 illustrates a waveform plot of capacitances versus reverse voltage in the TVS.

FIG. 6 illustrates current and voltage characteristics of TVS diode circuit 120 in waveform plot 250 for a 12V automobile system. FIG. 7 illustrates current and voltage characteristics of TVS diode circuit 120 in waveform plot 252 for a 24V automobile system. The junction capacitance versus voltage (dCJ/dVR) of a high-voltage TVS diode alone, absent the low-capacitance snap-back TVS, is inherently non-linear and a major contribution to the unwanted third-order harmonics. The harmonic distortion and intermodulation distortion products are generated because of the high-voltage TVS diode's non-linearity. The dependency of a junction capacitance CJ versus the applied voltage V can be seen in equation (1). The grading coefficient reflects the abruptness of the PN junction.

$$CJ=CJ0/(1-V/VJ)^m, \quad (1)$$

where: CJ0 is junction capacitance at 0V
VJ is the junction potential
M is grading coefficient FIG. 8 illustrates junction capacitance and reverse voltage characteristics of TVS diode circuit 120 with low-voltage TVS diode 150 and diode bridge 160-162, 168-170, or TVS diode circuit 180, in waveform plot 254. The capacitance between terminals 122 and 124 of TVS diode circuit 120 is substantially linear. Second order harmonics are generated due to asymmetry of TVS diode circuit 120. The diode bridge 160-162, 168-170 increases the device voltage in the reverse polarity, thus providing a balanced configuration to suppress second order harmonics over a unidirectional TVS configuration.

The series combination of the high-voltage TVS diode 140 and the low-capacitance snap-back TVS diode 150 with bridge 160-162, 168-170, or TVS diode circuit 180, reduces the grading coefficient, and improves capacitive linearity. TVS diode circuit 120 or 180 provides protection for RF antenna 102 with controllable, asymmetrical or symmetrical triggering voltage, low-capacitance and low-harmonic generation, low clamping voltage, fast response time, and ability to withstand 12V and 24V short-to-battery conditions.

While one or more embodiments of the present invention have been illustrated in detail, the skilled artisan will appreciate that modifications and adaptations to those embodiments may be made without departing from the scope of the present invention as set forth in the following claims.

What is claimed:

1. A transient voltage suppression (TVS) circuit, comprising:
   a first diode including a cathode coupled to a first terminal of the TVS circuit and an anode coupled to a first node;
   a silicon controlled rectifier including an anode coupled to a second node and a cathode coupled to a third node;
   a second diode including a cathode coupled to the first node and an anode coupled to the second node;
   a third diode including an anode coupled to the first node and a cathode coupled to the third node;
   a fourth diode including an anode coupled to the second node and a cathode coupled to a second terminal of the TVS circuit; and
   a fifth diode including an anode coupled to the second terminal and a cathode couple to the third node to provide the TVS circuit.

2. The TVS circuit of claim 1, wherein the first diode is disposed within a high voltage portion of the TVS circuit.

3. The TVS circuit of claim 1, wherein the silicon controlled rectifier is disposed within a low voltage portion of the TVS circuit.

4. The TVS circuit of claim 1, wherein the first diode and silicon controlled rectifier are disposed on a common semiconductor die.

5. The TVS circuit of claim 1, wherein the first diode is disposed on a first semiconductor die and the silicon controlled rectifier is disposed on a second semiconductor die.

6. The TVS circuit of claim 1, wherein the silicon controlled rectifier includes:
   a first transistor comprising a first conduction terminal coupled to the second node; and
   a second transistor comprising a first conduction terminal coupled to a control terminal of the first transistor, a control terminal coupled to a second conduction terminal of the first transistor, and a second conduction terminal coupled to the third node.

7. A transient voltage suppression (TVS) circuit, comprising:
   a first TVS diode coupled between a first terminal of the TVS circuit and a first node;
   a silicon controlled rectifier including an anode coupled to a second node and a cathode coupled to a third node; and a diode bridge coupled between the second node and third node and a second terminal of the TVS circuit, wherein the diode bridges include,
  (a) a second diode comprising a cathode coupled to the first node and an anode coupled to the second node,
  (b) a third diode comprising an anode coupled to the first node and a cathode coupled to the third node,
  (c) a fourth diode comprising an anode coupled to the second node and a cathode coupled to a second terminal of the TVS circuit, and
  (d) a fifth diode comprising an anode coupled to the second terminal and a cathode couple to the third node.

8. The TVS circuit of claim 7, further including a second TVS diode coupled between the second terminal and an intermediate node of the diode bridge.

9. The TVS circuit of claim 7, wherein the first TVS diode and silicon controlled rectifier are disposed on a common semiconductor die.

10. The TVS circuit of claim 7, wherein the first TVS diode is disposed on a first semiconductor die and the silicon controlled rectifier is disposed on a second semiconductor die.

11. The TVS circuit of claim 7, wherein the silicon controlled rectifier includes:
  a first transistor comprising a first conduction terminal coupled to the second node; and
  a second transistor comprising a first conduction terminal coupled to a control terminal of the first transistor, a control terminal coupled to a second conduction terminal of the first transistor, and a second conduction terminal coupled to the third node.

12. The TVS circuit of claim 7, wherein the first TVS diode is disposed within a high voltage portion of the TVS circuit, and the silicon controlled rectifier is disposed within a low voltage portion of the TVS circuit.

13. A method of making a transient voltage suppression (TVS) circuit, comprising:
  providing a first TVS diode coupled between a first terminal of the TVS circuit and a first node;
  providing a silicon controlled rectifier including an anode coupled to a second node and a cathode coupled to a third node; and
  providing a diode bridge coupled between the second node and third node and a second terminal of the TVS circuit by,
    (a) providing a second diode comprising a cathode coupled to the first node and an anode coupled to the second node,
    (b) providing a third diode comprising an anode coupled to the first node and a cathode coupled to the third node,
    (c) providing a fourth diode comprising an anode coupled to the second node and a cathode coupled to a second terminal of the TVS circuit, and
    (d) providing a fifth diode comprising an anode coupled to the second terminal and a cathode couple to the third node.

14. The method of claim 13, further including providing a second TVS diode coupled between the second terminal and an intermediate node of the diode bridge.

15. The method of claim 13, wherein the first TVS diode and silicon controlled rectifier are disposed on a common semiconductor die.

16. The method of claim 13, wherein the first TVS diode is disposed on a first semiconductor die and the silicon controlled rectifier is disposed on a second semiconductor die.

17. The method of claim 13, wherein providing the silicon controlled rectifier includes:
  providing a first transistor comprising a first conduction terminal coupled to the second node; and
  providing a second transistor comprising a first conduction terminal coupled to a control terminal of the first transistor, a control terminal coupled to a second conduction terminal of the first transistor, and a second conduction terminal coupled to the third node.

18. The method of claim 13, wherein the first TVS diode is disposed within a high voltage portion of the TVS circuit, and the silicon controlled rectifier is disposed within a low voltage portion of the TVS circuit.

* * * * *

UNITED STATES PATENT AND TRADEMARK OFFICE
CERTIFICATE OF CORRECTION

PATENT NO. : 11,776,951 B2  
APPLICATION NO. : 17/662890  
DATED : October 3, 2023  
INVENTOR(S) : Liping Ren et al.

Page 1 of 1

It is certified that error appears in the above-identified patent and that said Letters Patent is hereby corrected as shown below:

In the Claims

Column 6, Claim 1, Line 39, replace the word "couple" with -- coupled --.

Column 7, Claim 7, Line 12, replace the word "couple" with -- coupled --.

Column 8, Claim 13, Line 17, replace the word "couple" with -- coupled --.

Signed and Sealed this
Seventh Day of November, 2023

Katherine Kelly Vidal
*Director of the United States Patent and Trademark Office*